US011552642B2

United States Patent
Chen et al.

(10) Patent No.: US 11,552,642 B2
(45) Date of Patent: Jan. 10, 2023

(54) CHARGE PUMP PHASE-LOCKED LOOP BASED ON UNIPOLAR THIN FILM TRANSISTOR, CHIP, AND METHOD

(71) Applicant: South China University of Technology, Guangzhou (CN)

(72) Inventors: Rongsheng Chen, Guangzhou (CN); Hui Li, Guangzhou (CN); Yuming Xu, Guangzhou (CN); Mingzhu Wen, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 17/386,678

(22) Filed: Jul. 28, 2021

(65) Prior Publication Data

US 2022/0116046 A1 Apr. 14, 2022

(30) Foreign Application Priority Data

Oct. 13, 2020 (CN) .......................... 202011089549.4

(51) Int. Cl.
*H03L 7/08* (2006.01)
*H03K 17/687* (2006.01)

(52) U.S. Cl.
CPC ........... *H03L 7/08* (2013.01); *H03K 17/6874* (2013.01)

(58) Field of Classification Search
CPC ..... H03L 7/08; H02M 1/0083; H03K 17/6874
See application file for complete search history.

(56) References Cited

U.S. PATENT DOCUMENTS

| 6,348,839 | B1 * | 2/2002 | Aramaki | ................ | H03B 27/00 |
| | | | | | 327/280 |
| 8,749,284 | B2 * | 6/2014 | Hsu | ....................... | H03L 7/0896 |
| | | | | | 327/148 |

OTHER PUBLICATIONS

Lin et al., "A Phase-Locked Loop With Self-Calibrated Charge Pumps in 3-um LTPS-TFT Technology", Feb. 2009, IEEE Transactions on Circuits and Systems, vol. 56, No. 2, pp. 142-146 (Year: 2009).*

* cited by examiner

*Primary Examiner* — Ryan Johnson
*Assistant Examiner* — Colleen J O Toole
(74) *Attorney, Agent, or Firm* — Epstein Drangel LLP; Robert L. Epstein

(57) ABSTRACT

Disclosed is a charge-pump phase-locked loop based on a unipolar thin film transistor, a chip, and a method. The phase-locked loop may include: a phase-frequency detector, configured to detect a phase difference and a frequency difference between a clock $F_{ref}$ and a clock $F_n$ and generate control signals UP and DOWN; a logic control module, configured to output logic state signals; a charge pump, configured to convert the logic state signals into a charging/discharging current signal; a low-pass filter, configured to output a direct-current analog control signal $V_{ctrl}$; a voltage-controlled oscillator, configured to adjust an output clock frequency $F_{vco}$; and a divide-by-four circuit, configured to perform frequency division to obtain the clock $F_n$.

9 Claims, 3 Drawing Sheets

CHARGE PUMP PHASE-LOCKED LOOP BASED ON UNIPOLAR THIN FILM TRANSISTOR, CHIP, AND METHOD

CROSS-REFERENCE TO RELATED APPLICATION

This application claims priority to Chinese patent application No. 202011089549.4, filed Oct. 13, 2020, the content of which is incorporated herein by reference in its entirety.

TECHNICAL FIELD

The present disclosure relates to the field of semiconductor integrated circuits, and more particularly, to a charge-pump phase-locked loop based on a unipolar thin film transistor, a chip, and a method.

BACKGROUND

Currently, flexible electronic products are booming. They have many new characteristics. For example, they can be completely bent to the diameter of hair, and are stretchable, foldable, transparent, ultra-light, and economical. Therefore, compared with silicon electronic products, they are potentially integrated into our environment and life. The latest progress in performance of flexible transistors now makes application thereof in wireless communication systems possible.

Although a thin film technology has many advantages, currently, a metal oxide thin film transistor (TFT) technology only covers high-performance n-type transistors, but does not cover any high-performance p-type device complementary to the n-type transistor. In most cases, circuit design is challenged due to the lack of high-performance complementary devices. In this case, TFT circuits can be implemented only based on unipolar transistors, and a conventional CMOS phase-locked loop circuit design technology is no longer applicable. Most unipolar phase-locked loop circuits have several shortcomings such as large charge pump mismatch, phase noise, poor stray and jitter performance, and large clock offset.

SUMMARY

To solve one of the technical problems in the prior art to at least some extent, the present disclosure is intended to provide a charge-pump phase-locked loop based on a unipolar TFT, a chip, and a method. The charge-pump phase-locked loop can reduce phase noise, and also achieves a faster phase locking speed than earlier operation.

The technical solution adopted in the present disclosure are:

a charge-pump phase-locked loop based on a unipolar TFT, including:

a phase-frequency detector, configured to detect a phase difference and a frequency difference between an input reference clock $F_{ref}$ and a clock $F_n$ subjected to frequency division by a divide-by-four frequency divider, and generate two control signals UP and DOWN;

a logic control module, configured to output four logic state signals to a charge pump according to the two control signals UP and DOWN;

the charge pump, configured to convert the logic state signals into a charging/discharging current signals to charge/discharge the capacitors inside a low-pass filter;

the low-pass filter, configured to convert a pulse signal output by the charge pump into a direct-current analog control signal $V_{ctrl}$;

a voltage-controlled oscillator, configured to adjust an output clock frequency $F_{vco}$ according to the direct-current analog control signal $V_{ctrl}$; and a divide-by-four circuit, configured to perform a divide-by-four frequency division of the output clock frequency $F_{vco}$ to obtain the clock $F_n$, where the voltage-controlled oscillator is composed of a fourth-stage differential delay unit to achieve low noise.

Further, the fourth-stage differential delay unit includes a first differential delay unit, a second differential delay unit, a third differential delay unit, and a fourth differential delay unit; and the output end of the first differential delay unit is connected to the input end of the second deferential delay unit, the output end of the second differential delay unit is connected to the input end of the third differential delay unit, the output end of the third differential delay unit is connected to the input end of the fourth differential delay unit, and the output end of the fourth differential delay unit is connected to the input end of the first differential delay unit.

Further, the differential delay unit is composed of a differential pair having positive feedback.

Further, the differential delay unit includes a first transistor, a second transistor, a third transistor, a fourth transistor, a fifth transistor, a sixth transistor, a seventh transistor, an eighth transistor, a ninth transistor, and a tenth transistor;

the gate of the seventh transistor serves as a first input end of the differential delay unit, the gate of the eighth transistor serves as a second input end of the differential delay unit, the drain of the eighth transistor serves as a first output end of the differential delay unit, and the drain of the seventh transistor serves as a second output end of the differential delay unit;

the gate of the third transistor is connected to the drain of the seventh transistor, the gate of the fourth transistor is connected to the drain of the eighth transistor, the drain of the third transistor is connected to a power supply through the first transistor, the drain of the fourth transistor is connected to the power supply through the second transistor, and the gates of the first transistor and the second transistor are both connected to the power supply;

the drain of the seventh transistor is connected to the power supply through the fifth transistor, the drain of the eighth transistor is connected to the power supply through the sixth transistor, the gate of the fifth transistor is connected to the drain of the fourth transistor, and the gate of the sixth transistor is connected to the drain of the third transistor; and the drain of the ninth transistor is separately connected to the source of the third transistor and the source of the fourth transistor, the drain of the tenth transistor is separately connected to the source of the seventh transistor and the source of the eighth transistor, the source of the ninth transistor and the source of the tenth transistor are both grounded, and the gate of the ninth transistor and the gate of the tenth transistor are both connected to a bias voltage.

Further, the fifth transistor and the sixth transistor remain in a saturation region, acting as high-load impedance.

Further, the ninth transistor and the tenth transistor serve as voltage sources, and the bias voltage is used for controlling the oscillation frequency of the differential delay unit.

Further, the four logic state signals are $U_1$, $\overline{U_1}$, $\overline{P_1}$, and $P_1$, respectively, and the charge pump is composed of two N-type TFT coupling pairs, including a first coupling pair and a second coupling pair;

the first coupling pair includes a first switching transistor and a second switching transistor, the gate of the first switching transistor is connected to the signal $P_1$, and the gate of the second switching transistor is connected to the signal $\overline{P_1}$; and the second coupling pair includes a third switching transistor and a fourth switching transistor, the gate of the third switching transistor is connected to the signal $U_1$, and the gate of the fourth switching transistor is connected to the signal $\overline{U_1}$.

Further, the first coupling pair further includes a first transistor pair, a second transistor pair, and a thirteenth transistor;

the gate of the first transistor pair is connected to the signal $\overline{P_1}$, the source of the first transistor pair is connected to the drain of the first switching transistor, the drain of the first transistor pair is connected to a power supply, the gate and the drain of the second transistor pair are connected to the power supply, the source of the second transistor pair is connected to the drain of the second switching transistor, the thirteenth transistor serves as a current source, and the drain of the thirteenth transistor is separately connected to the source of the first switching transistor and the source of the second switching transistor;

the second coupling pair further includes a third transistor pair, a fourth transistor pair, and a fourteenth transistor; and the gate and the drain of the third transistor pair are both connected to the power supply, the source of the third transistor pair is connected to the drain of the third switching transistor, the gate of the fourth transistor pair is connected to the drain of the first switching transistor, the drain of the fourth transistor pair is connected to the power supply, the source of the fourth transistor pair is connected to the drain of the fourth switching transistor, the fourteenth transistor serves as a current source, and the drain of the fourteenth transistor is separately connected to the source of the third switching transistor and the source of the fourth switching transistor.

Another technical solution adopted in the present disclosure is:

a chip, including the charge-pump phase-locked loop based on a unipolar TFT described above.

Another technical solution adopted in the present disclosure is:

a control method applied to the charge-pump phase-locked loop based on a unipolar TFT as described above, including the following steps:

detecting a phase difference and a frequency difference between an input reference clock $F_{ref}$ and a clock $F_n$ subjected to frequency division, and generating two control signals UP and DOWN;

outputting four logic state signals according to the two control signals UP and DOWN;

converting the logic state signals into a charging/discharging current signal, and converting a pulse signal of the charging/discharging current signal into a direct-current analog control signal $V_{ctrl}$; and adjusting an output clock frequency $F_{vco}$ according to the direct-current analog control signal $V_{ctrl}$, and performing divide-by-four frequency division on the output clock frequency $F_{vco}$ to obtain the clock $F_n$.

The beneficial effects of the present disclosure are as follows: in the present disclosure, the logic control module is added to the loop, so as to provide four operating states for the charge pump, eliminate a "dead zone" state caused by too short reset state time, and keep the current source in a normally on state, so that loop stability is improved, and the operating speed of the charge pump is increased. In addition, the voltage-controlled oscillator composed of differential structure delay stages is used, thereby achieving a higher anti-noise capability than a single-ended structure, significantly reducing jitter of the output frequency, and mitigating phase noise.

BRIEF DESCRIPTION OF DRAWINGS

To describe the technical solutions in embodiments of the present disclosure or the prior art more clearly, the accompanying drawings for the related technical solutions in the embodiments of the present disclosure or in the prior art are introduced below. It should be understood that the accompanying drawings introduced below are merely intended to clearly express some embodiments of the technical solutions of the present disclosure, and a person skilled in the art can still obtain other accompanying drawings from these accompanying drawings without creative efforts.

DESCRIPTION OF EMBODIMENTS

Figure 1:
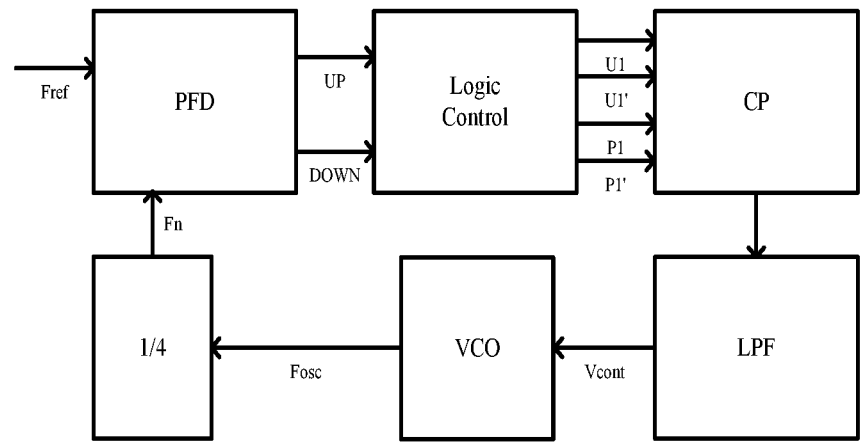
FIG. 1 is a schematic structure diagram of a charge pump phase-locked loop circuit in an embodiment of the present disclosure.

Embodiments of the present disclosure are described in detail below. Examples of the embodiments are shown in the accompanying drawings. The same or similar reference numerals are used from first to last to indicate the same or similar elements or elements having the same or similar functions. The embodiments described below regarding the accompanying drawings are exemplary, are only used for explaining the present disclosure, and cannot be understood as limitations to the present disclosure. Step numbers in the embodiments below are set merely for illustration and make no limitation to the order of steps. The execution order of the steps in the embodiments can be adaptively adjusted depending on the understanding of a person skilled in the art.

In the description of the present disclosure, it should be understood that the orientation description involved, for example, the orientation or position relationship indicated by terms including "up", "down", "front", "back", "left", "right", etc. being based on the orientation or position relationship shown in the accompanying drawings, is merely intended to facilitate description of the present disclosure and simplification of the description, instead of indicating or implying that an involved apparatus or element must have a specific orientation or must be constructed and operated in a specific orientation, and thus cannot be understood as a limitation to the present disclosure.

In the description of the present disclosure, the term "several" means "one or more", the term "a plurality of" means "two or more", the term "greater than", "less than", "exceed" or the like is understood as not including the current number, and the term "above", "below", "within" or the like is understood as including the current number. The expressions "first" and "second" are merely intended for distinguishing technical features and cannot be understood as indicating or implying relative importance or implicitly specifying the number of indicated technical features, or implicitly specifying the order of indicated technical features.

In the description of the present disclosure, unless otherwise specified, terms such as "set", "install", and "connect" should be understood in a broad sense. A person skilled in the art can reasonably determine the specific meanings of the above terms in the present disclosure in combination with the specific contents of the technical solutions.

As shown in FIG. 1, this embodiment provides a charge pump (CP) phase-locked loop (PLL) circuit, including a phase-frequency detector (PFD), a logic control module, a CP, a low pass filter (LPF), a voltage-controlled oscillator (VCO), and a divide-by-four circuit.

The PFD detects a phase difference and a frequency difference between an input reference clock $F_{ref}$ and a clock $F_n$ subjected to frequency division by a frequency divider and generates two control signals UP and DOWN. The following logic control module outputs four logic states to the CP. A CP circuit converts these logic state signals into a charging/discharging current signal to charge/discharge a capacitor inside the LPF. The loop filter converts a pulse signal output by the CP into a direct-current analog control signal $V_{ctrl}$, the VCO adjusts an output clock frequency $F_{vco}$ according to the amplitude of the control voltage $V_{ctrl}$. Then $F_n$ is obtained through the divide-by-four circuit, so that the entire loop is stable. The VCO is composed of a four-stage differential delay unit, to implement a low-noise VCO, reduce phase noise of the entire PLL, and improve stability.

The CP PLL circuit of this embodiment is composed of only unipolar transistors and applies to flexible electronics technology (such as thin-film transistors (TFTs)). The circuit has a novel structure in which the VCO has low phase noise, and the CP has low jitter. Improvement is made based on a CP PLL to improve the performance of the VCO, improve the performance of the CP by adding the logic control module, and achieve fast locking and low phase noise. The VCO is composed of the four-stage differential delay unit, and a completely symmetrical delay unit structure greatly reduces phase noise and has good voltage-frequency linearity. The low-jitter CP eliminates a "dead zone" state, and a charge injection cancellation circuit is added to successfully achieve low jitter. This embodiment solves the problems of phase noise and jitter of existing CP PLLs based on a unipolar TFT and successfully achieves low noise and low jitter.

I. Design of a Low-Jitter CP Circuit

Conventional CPs have many disadvantages, such as slow conversion speed, channel charge injection, and clock feedthrough. In addition, a PLL jitter may be caused when the delay time of a PFD reset pulse signal is insufficient to cause a dead zone or when the current mismatch of the CP causes circuit clutter and charge sharing causes control voltage fluctuation.

In consideration of these disadvantages, a CP structure is used in this embodiment to increase the operating speed of the circuit. The CP comprises two N-type TFT coupling pairs, which control the on or off of a switch. The structure also relates to adding a match to each branch to achieve zero offsets. To eliminate errors caused by channel charge injection when the switch is turned off, a charge injection elimination structure is introduced in a current control CP, eliminating the error caused by channel charge injection when the switch is turned off. The complete schematic diagram of the CP is shown in FIG. 2.

Figure 2:
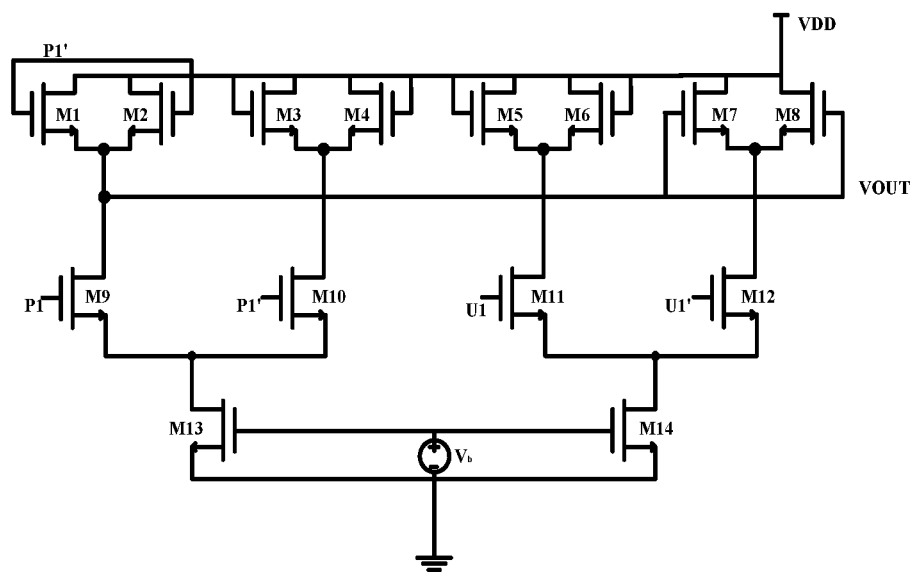
FIG. 2 is a schematic circuit diagram of a charge pump in an embodiment of the present disclosure.

Referring to FIG. 2, the CP includes a first coupling pair and a second coupling pair; the first coupling pair includes a first switching transistor M9, a second switching transistor M10, a first transistor pair (transistors M1 and M2 in FIG. 2), a second transistor pair (transistors M3 and M4 in FIG. 2), and a thirteenth transistor M13; the second coupling pair includes a third switching transistor M11, a fourth switching transistor M12, a third transistor pair (transistors M5 and M6 in FIG. 2), a fourth transistor pair (transistors M7 and M8 in FIG. 2), and a fourteenth transistor M14;

the gate of the first switching transistor M9 is connected to the signal $P_1$, and the gate of the second switching transistor M10 is connected to the signal $\overline{P}_1$; the gate of the first transistor pair is connected to the signal $\overline{P}_1$, the source of the first transistor pair is connected to the drain of the first switching transistor M9, the drain of the first transistor pair is connected to a power supply, the gate and the drain of the second transistor pair are connected to the power supply, the source of the second transistor pair is connected to the drain of the second switching transistor M10, the thirteenth transistor M13 serves as a current source, and the drain of the thirteenth transistor M13 is separately connected to the source of the first switching transistor M9 and the source of the second switching transistor M10;

the gate and the drain of the third transistor pair are both connected to the power supply, the source of the third transistor pair is connected to the drain of the third switching transistor M11, the gate of the fourth transistor pair is connected to the drain of the first switching transistor M9, the drain of the fourth transistor pair is connected to the power supply, the source of the fourth transistor pair is connected to the drain of the fourth switching transistor M12, the fourteenth transistor M14 serves as a current source, and the drain of the fourteenth transistor M14 is separately connected to the source of the third switching transistor M11 and the source of the fourth switching transistor M12.

Input signals of the CP are generated by the logic control module from output signals UP and DOWN of the PFD, including $U_1$, $\overline{U}_1$, $\overline{P}_1$, and $P_1$. Under the control of the signals, the CP has three states: $R_1$, $R_2$, and $R_3$:

$R_1$: a charging state (DOWN=0, UP=1)
$R_2$: an off state (DOWN=0, UP=0| DOWN=1, UP=1)
$R_3$: a discharging state (DOWN=1, UP=0)

Compared with conventional PLLs, the fourth on state is canceled, thereby eliminating the "dead zone" state caused when the delay time of the PFD reset pulse signal is insufficient and solving the current mismatch problem caused by inconsistent switching time.

Under the control of the three states, no matter what state an output should be, the overall CP circuit remains in an on state. When the output needs to be charged or discharged, the current value will not start to rise from 0. Instead, a desired current value is directly used to charge or discharge an output terminal. Such a structure greatly increases the charging/discharging speed of the CP, and there is no need to charge/discharge a source-substrate parasitic capacitor of a switching transistor, thereby eliminating charge shunting. It is found in the study that when the switch is turned off, an error may occur to a TFT device due to channel charge injection. This phenomenon is called the effect of charge injection. To solve this problem, a charge injection elimination circuit is designed at each end of the CP switch. As shown in FIG. 2, input signals of the switching transistors M9, M10, M11, and M12 are differential signals, M13 and M14 serve as the current sources, and when the switching transistors operate, a pull-up switch and a pull-down switch of the CP form the charge injection elimination circuit.

II. Design of a Low-Noise VCO Circuit

Figure 3:
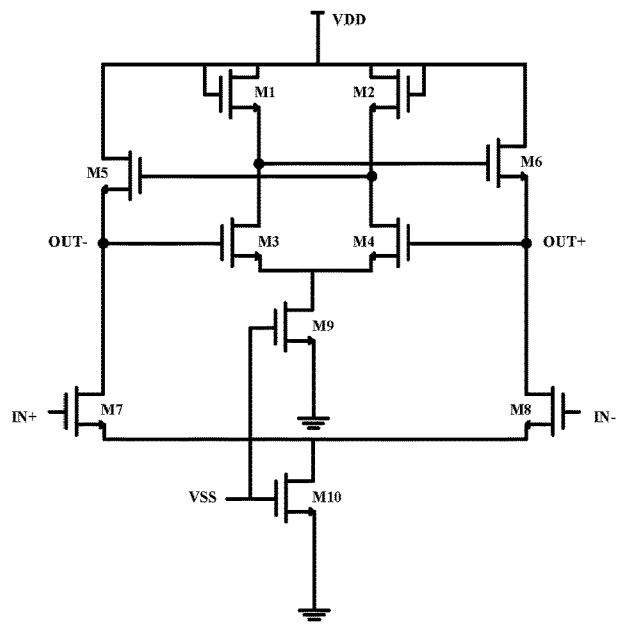
FIG. 3 is a schematic circuit diagram of a differential delay unit in an embodiment of the present disclosure.
Figure 4:
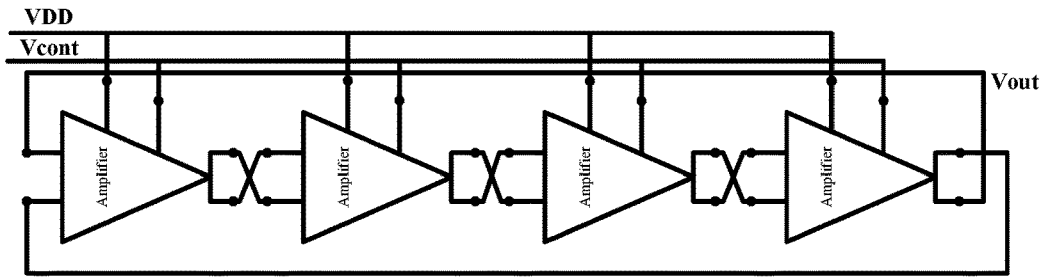
FIG. 4 is a schematic structure diagram of a voltage-controlled oscillator in an embodiment of the present disclosure.

In this embodiment, four differential delay units are used to form the VCO. As shown in FIG. 3, each delay unit is composed of a differential pair having positive feedback, and a tail transistor is used to control the oscillation frequency. Such a control structure has a higher anti-noise capability than single-ended circuits. As the $V_{cont}$ increases and the $I_{ss}$ becomes larger, the transistor exhibits a greater transconductance, thereby reducing the time constant of an output node. The VCO composed of cascaded differential delay units is shown in FIG. 4.

As shown in FIG. 3, the delay unit includes a first transistor M1, a second transistor M2, a third transistor M3, a fourth transistor M4, a fifth transistor M5, a sixth transistor M6, a seventh transistor M7, an eighth transistor M8, a ninth transistor M9, and a tenth transistor M10;

the gate of the seventh transistor M7 serves as a first input end of the differential delay unit, the gate of the eighth transistor M8 serves as a second input end of the differential delay unit, the drain of the eighth transistor M8 serves as a first output end of the differential delay unit, and the drain of the seventh transistor M7 serves as a second output end of the differential delay unit;

the gate of the third transistor M3 is connected to the drain of the seventh transistor M7, the gate of the fourth transistor M4 is connected to the drain of the eighth transistor M8, the drain of the third transistor M3 is connected to a power supply through the first transistor M1, the drain of the fourth transistor M4 is connected to the power supply through the second transistor M2, and the gates of the first transistor M1 and the second transistor M2 are both connected to the power supply;

the drain of the seventh transistor M7 is connected to the power supply through the fifth transistor M5, the drain of the eighth transistor M8 is connected to the power supply through the sixth transistor M6, the gate of the fifth transistor M5 is connected to the drain of the fourth transistor M4, and the gate of the sixth transistor M6 is connected to the drain of the third transistor M3; and the drain of the ninth transistor M9 is separately connected to the source of the third transistor M3 and the source of the fourth transistor M4, the drain of the tenth transistor M10 is separately connected to the source of the seventh transistor M7 and the source of the eighth transistor M8, the source of the ninth transistor M9 and the source of the tenth transistor M10 are both grounded, and the gate of the ninth transistor M9 and the gate of the tenth transistor M10 are both connected to a bias voltage VSS.

In the differential delay unit, M5 and M6 remain in a saturation region, and the gates thereof are almost short-circuited to the sources thereof. Such a configuration acts as a high-load impedance and increases voltage gain, thereby reducing the influence of noise. In addition, the output signals are changed synchronously, and the charging/discharging speed of the $V_{out}-$ and the $V_{out}+$ can be increased so that the node voltage conversion speed is increased. Then the performance of the circuit in phase noise suppression is improved.

Due to low-temperature manufacturing, the TFT process has higher flicker noise than the CMOS process. The differential delay unit has a completely symmetrical structure, so that the rising edge and the falling edge of a waveform output by the oscillator are symmetrical, thereby greatly reducing the flicker noise component near a fundamental wave.

An output frequency expression is as follows:

$$R_L = \frac{V_{sw}}{I_{SS}}, t_d = \frac{C_L V_{sw}}{I_{SS}}$$
$$f_{osc} = \frac{1}{2Nt_d} = \frac{I_{SS}}{V_{sw}C_L}$$

where $V_{sw}$ is a unilateral output swing amplitude of a differential ring oscillator, $t_d$ is the delay time of the differential delay unit, $$\frac{I_{SS}}{C_L}$$

is the delay time of the differential delay unit, and N is the stage number of the delay unit in the differential ring oscillator.

Figure 5:
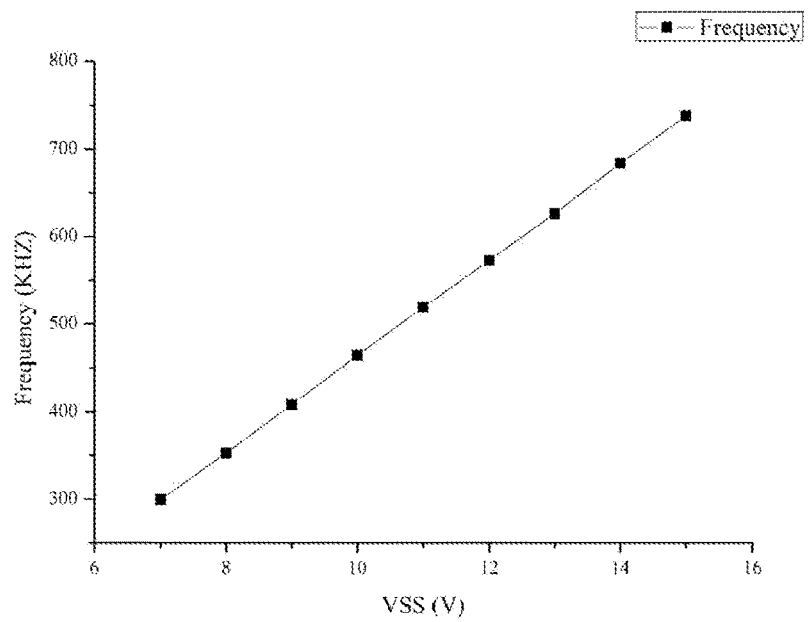
FIG. 5 is a schematic relationship diagram of oscillation frequency and control voltage in an embodiment of the present disclosure.
Figure 6:
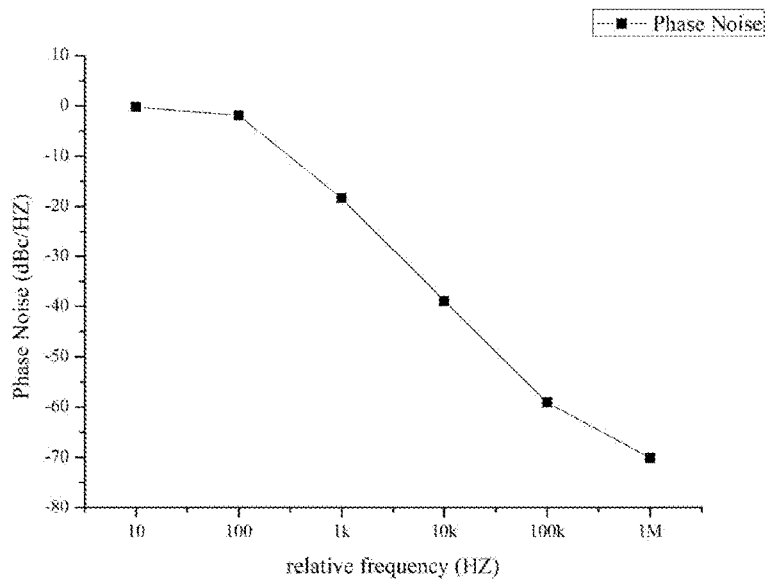
FIG. 6 is a schematic diagram of phase noise of a voltage-controlled oscillator in an embodiment of the present disclosure.

By changing the VSS, the delay of a stage is controlled, and then the VCO frequency is controlled. A higher control voltage will increase the current of each stage, reduce the delay time of each stage, and thus increase the oscillation frequency. In this embodiment, the operating voltage is 12 V. It can be seen from a simulation result in FIG. 5 that the center oscillation frequency of the VCO is 400 KHZ, and the oscillation frequency changes linearly with the control voltage, which can further improve the stability of the PLL and reduce phase errors. The phase noise output by the VCO is shown in FIG. 6. The phase noise at an offset of 1 KHZ is 18.8 dB. Compared with other TFT device-based VCO modules, the phase noise has been minimized within the entire tuning range. Similarly, a control system refers to a single control point, making control in a PLL control unit easier.

Figure 7:
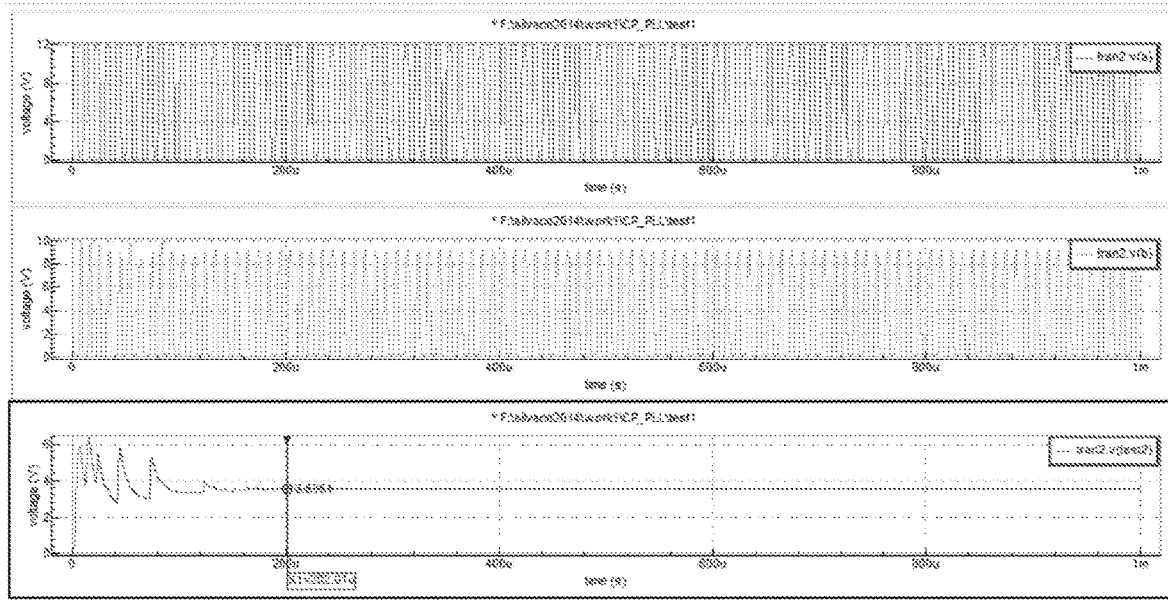
FIG. 7 is a schematic diagram of a locking process of a charge-pump phase-locked loop in an embodiment of the present disclosure.

Referring to FIG. 7, the PLL circuit can find a correct frequency at 200 us to achieve frequency and phase locking.

In conclusion, the CP PLL circuit of these embodiments has at least the following beneficial effects:

(1) According to the low-jitter CP circuit designed in this embodiment, the charge injection phenomenon is eliminated during the operating time of the PLL so that the CP achieves zero offset, and then the low jitter of the PLL is achieved.

(2) The logic control module is added to the loop to provide four operating states for the CP, eliminate the "dead zone" state caused by too short reset state time, and keep the current source in the normally on state, so that loop stability is improved, and the operating speed of the charge pump is increased.

(3) The VCO composed of differential structure delay stages is used so as to achieve a higher anti-noise capability than a single-ended structure, significantly reduce jitter of the output frequency, and mitigate phase noise.

This embodiment further provides a chip, including the CP PLL circuit described above.

The chip of this embodiment includes the CP PLL circuit described above and has corresponding functions and beneficial effects of the CP PLL circuit.

This embodiment further provides a control method, including the following steps:

detecting a phase difference and a frequency difference between an input reference clock $F_{ref}$ and a clock $F_n$ subjected to frequency division, and generating two control signals UP and DOWN;

outputting four logic state signals according to the two control signals UP and DOWN;

converting the logic state signals into a charging/discharging current signal, and converting a pulse signal of the charging/discharging current signal into a direct-current analog control signal $V_{ctrl}$; and adjusting an output clock frequency $F_{vco}$ according to the direct-current analog control signal $V_{ctrl}$, and performing divide-by-four frequency division on the output clock frequency $F_{vco}$ to obtain the clock $F_n$.

The control method of this embodiment is a con-to-one correspondence to the CP PLL circuit described above and thus has corresponding functions and beneficial effects of the CP PLL circuit.

In some optional embodiments, the functions/operations mentioned in a block diagram may be executed out of order mentioned in the operation diagram. For example, depending on the functions/operations involved, two blocks shown in succession may actually be executed substantially simultaneously, or sometimes, the blocks may be executed in reverse order. In addition, the embodiments presented and described in the flowchart of the present disclosure are provided in the form of examples aimed at providing a more comprehensive understanding of the technology. The method recited is not limited to the operations and logic flow presented herein. The optional embodiments can be expected, in which the order of various operations can be changed, and sub-operations described as part of a larger operation are executed independently.

In addition, although the present disclosure is described in the context of functional modules, it should be understood that, unless otherwise stated to the contrary, one or more of the functions and/or features described can be integrated with a single physical apparatus and/or in a software module, or one or more of functions and/or features can be implemented in a separate physical apparatus or software module. It can also be understood that a detailed discussion about the actual implementation of each module is not necessary for the understanding of the present disclosure. To be more exact, considering the attributes, functions, and internal relationships of various functional modules in the apparatus recited herein, the actual implementation of the modules would be understood within conventional techniques of engineers. Therefore, a person skilled in the art could implement the present disclosure set forth in the claims using ordinary techniques without undue experimentation. It can also be understood that the specific concepts recited are merely illustrative and are not intended to limit the scope of the present disclosure. The scope of the present disclosure is determined by the scopes of the appended claims and equivalent solutions thereof.

When a function is implemented in the form of a software functional unit and sold or used as an independent product, the function may be stored in a computer-readable storage medium. Based on such understanding, the technical solutions of the present disclosure essentially or the part contributing to the prior art or part of the technical solutions may be embodied in the form of a software product. The computer software product is stored in a storage medium. It includes several instructions so that a computer device (which may be a personal computer, a server, a network device, and the like) implements all or some steps of the method in the embodiments of the present disclosure. Moreover, the foregoing storage medium includes various media having program codes stored, such as a USB flash drive, a mobile hard disk drive, a read-only memory (ROM), a random access memory (RAM), a floppy disk, and an optical disc.

Logic and/or steps represented in the flowchart or described in other ways herein, for example, can be considered as a sequencing table of executable instructions for implementing logic functions and can be specifically implemented in any computer-readable medium, for use by instruction execution systems, apparatuses, or devices (such as computer-based systems, systems including processors, or other systems that can obtain instructions from the instruction execution systems, apparatuses or devices and execute same), or for use in combination with these instruction execution systems, apparatuses or devices. In terms of this specification, the "computer-readable medium" may be any apparatus that can include, store, communicate, propagate, or transmit a program for use by instruction execution systems, apparatuses, or devices or for use in combination with these instruction execution systems, apparatuses or devices.

More specific examples (a non-exhaustive list) of the computer-readable medium include: an electrical connection unit having one or more wirings (an electronic apparatus), a portable computer diskette (a magnetic apparatus), a RAM, a ROM, an erasable programmable read-only memory (EPROM or flash memory), a fiber apparatus, and a portable compact disk read-only memory (CD-ROM). In addition, the computer-readable medium may even be paper or other suitable media on which the program can be printed, because the program can be obtained electronically, for example, by optically scanning the paper or other media, then editing, interpreting or processing in other suitable ways if necessary, and then stored in computer memory.

It should be understood that each part of the present disclosure may be implemented by hardware, software, firmware or a combination thereof. In the foregoing embodiments, a plurality of steps or methods may be implemented by software or firmware stored in a memory and executed by a suitable instruction execution system. For example, suppose it is implemented by hardware, as in another embodiment. In that case, it can be implemented by anyone or a combination of the following techniques known in the art: a discrete logic circuit having a logic gate circuit for implementing a logic function for a data signal, a dedicated integrated circuit having a suitable combinational logic gate circuit, a Programmable Gate Array (PGA), a Field Programmable Gate Array (FPGA), etc.

In the foregoing description of this specification, the descriptions with reference to the terms "one implementation/embodiment", "another implementation/embodiment", "some implementations/embodiments" or the like mean that specific features, structures, materials or characteristics described in combination with the implementations or examples are included in at least one implementation or example of the present disclosure. In this specification, the schematic expressions of the foregoing terms do not necessarily refer to the same implementation or example. Moreover, the specific features, structures, materials or characteristics described may be combined appropriately way in any one or more implementations or examples.

Although the implementations of the present disclosure have been shown and described, a person skilled in the art could understand that various changes, modifications, replacements and variations can be made to these embodiments, without departing from the principle and purpose of the present disclosure. The scope of the present disclosure is defined by the claims and equivalents thereof.

The preferred implementations of the present disclosure are specified above; however, the present disclosure is not limited to the foregoing embodiments. A person skilled in the art could further make various equivalent variations or replacements, without departing from the spirit of the present disclosure. These equivalent variations or replacements all fall in the scope defined by the claims of the present application.

What is claimed is:

1. A charge-pump phase-locked loop based on a unipolar thin film transistor (TFT), comprising:
    a phase-frequency detector configured to detect a phase difference and a frequency difference between an input reference clock $F_{ref}$ and a clock $F_n$ subjected to frequency division by a divide-by-four frequency divider, and generate two control signals UP and DOWN;
    a logic control module configured to output four logic state signals to a charge pump according to the two control signals UP and DOWN;
    the charge pump configured to convert the logic state signals into a charging/discharging current signal to charge/discharge a capacitor inside a low-pass filter;
    the low-pass filter configured to convert a pulse signal output by the charge pump into a direct-current analog control signal $V_{ctrl}$;
    a voltage-controlled oscillator configured to adjust an output clock frequency $F_{vco}$ according to the direct-current analog control signal $V_{ctrl}$; and
    a divide-by-four circuit configured to perform divide-by-four frequency division on the output clock frequency $F_{vco}$ to obtain the clock $F_n$, wherein
    the voltage-controlled oscillator is composed of a fourth-stage differential delay unit to achieve low noise;
    wherein the four logic state signals are $U_1$, $\overline{U_1}$, $\overline{P_1}$, and $P_1$, respectively, and the charge pump is composed of two N-type TFT coupling pairs, comprising a first coupling pair and a second coupling pair;
    the first coupling pair comprises a first switching transistor and a second switching transistor, the gate of the first switching transistor is connected to the signal $P_1$, and the gate of the second switching transistor is connected to the signal $\overline{P_1}$; and
    the second coupling pair comprises a third switching transistor and a fourth switching transistor, the gate of the third switching transistor is connected to the signal $U_1$, and the gate of the fourth switching transistor is connected to the signal $\overline{U_1}$;
    wherein the differential delay unit comprises a first transistor, a second transistor, a third transistor, a fourth transistor, a fifth transistor, a sixth transistor, a seventh transistor, an eighth transistor, a ninth transistor, and a tenth transistor;
    wherein the gate of the seventh transistor serves as a first input end of the differential delay unit, the gate of the eighth transistor serves as a second input end of the differential delay unit, the drain of the eighth transistor serves as a first output end of the differential delay unit, and the drain of the seventh transistor serves as a second output end of the differential delay unit;
    wherein the gate of the third transistor is connected to the drain of the seventh transistor, the gate of the fourth transistor is connected to the drain of the eighth transistor, the drain of the third transistor is connected to a power supply through the first transistor, the drain of the fourth transistor is connected to the power supply through the second transistor, and the gates of the first transistor and the second transistor are both connected to the power supply;
    wherein the drain of the seventh transistor is connected to the power supply through the fifth transistor, the drain of the eighth transistor is connected to the power supply through the sixth transistor, the gate of the fifth transistor is connected to the drain of the fourth transistor, and the gate of the sixth transistor is connected to the drain of the third transistor; and
    wherein the drain of the ninth transistor is separately connected to the source of the third transistor and the source of the fourth transistor, the drain of the tenth transistor is separately connected to the source of the seventh transistor and the source of the eighth transistor, the source of the ninth transistor and the source of the tenth transistor are both grounded, and the gate of the ninth transistor and the gate of the tenth transistor are both connected to a bias voltage.

2. The charge-pump phase-locked loop of claim 1, wherein the fourth-stage differential delay unit comprises a first differential delay unit, a second differential delay unit, a third differential delay unit, and a fourth differential delay unit; and
    wherein the output end of the first differential delay unit is connected to the input end of the second deferential delay unit, the output end of the second differential delay unit is connected to the input end of the third differential delay unit, the output end of the third differential delay unit is connected to the input end of the fourth differential delay unit, and the output end of the fourth differential delay unit is connected to the input end of the first differential delay unit.

3. The charge-pump phase-locked loop of claim 1, wherein the differential delay unit comprises a differential pair having positive feedback.

4. The charge-pump phase-locked loop of claim 2, wherein the differential delay unit comprises a first transistor, a second transistor, a third transistor, a fourth transistor, a fifth transistor, a sixth transistor, a seventh transistor, an eighth transistor, a ninth transistor, and a tenth transistor;
    wherein the gate of the seventh transistor serves as a first input end of the differential delay unit, the gate of the eighth transistor serves as a second input end of the differential delay unit, the drain of the eighth transistor serves as a first output end of the differential delay unit, and the drain of the seventh transistor serves as a second output end of the differential delay unit;
    wherein the gate of the third transistor is connected to the drain of the seventh transistor, the gate of the fourth transistor is connected to the drain of the eighth transistor, the drain of the third transistor is connected to a power supply through the first transistor, the drain of the fourth transistor is connected to the power supply through the second transistor, and the gates of the first transistor and the second transistor are both connected to the power supply;
    wherein the drain of the seventh transistor is connected to the power supply through the fifth transistor, the drain of the eighth transistor is connected to the power supply through the sixth transistor, the gate of the fifth transistor is connected to the drain of the fourth transistor, and the gate of the sixth transistor is connected to the drain of the third transistor; and wherein the drain of the ninth transistor is separately connected to the source of the third transistor and the source of the fourth transistor, the drain of the tenth transistor is separately connected to the source of the seventh transistor and the source of the eighth transistor, the source of the ninth transistor and the source of the tenth transistor are both grounded, and the gate of the ninth transistor and the gate of the tenth transistor are both connected to a bias voltage.

5. The charge-pump phase-locked loop of claim 3, wherein the differential delay unit comprises a first transistor, a second transistor, a third transistor, a fourth transistor, a fifth transistor, a sixth transistor, a seventh transistor, an eighth transistor, a ninth transistor, and a tenth transistor;

wherein the gate of the seventh transistor serves as a first input end of the differential delay unit, the gate of the eighth transistor serves as a second input end of the differential delay unit, the drain of the eighth transistor serves as a first output end of the differential delay unit, and the drain of the seventh transistor serves as a second output end of the differential delay unit;

wherein the gate of the third transistor is connected to the drain of the seventh transistor, the gate of the fourth transistor is connected to the drain of the eighth transistor, the drain of the third transistor is connected to a power supply through the first transistor, the drain of the fourth transistor is connected to the power supply through the second transistor, and the gates of the first transistor and the second transistor are both connected to the power supply;

wherein the drain of the seventh transistor is connected to the power supply through the fifth transistor, the drain of the eighth transistor is connected to the power supply through the sixth transistor, the gate of the fifth transistor is connected to the drain of the fourth transistor, and the gate of the sixth transistor is connected to the drain of the third transistor; and wherein the drain of the ninth transistor is separately connected to the source of the third transistor and the source of the fourth transistor, the drain of the tenth transistor is separately connected to the source of the seventh transistor and the source of the eighth transistor, the source of the ninth transistor and the source of the tenth transistor are both grounded, and the gate of the ninth transistor and the gate of the tenth transistor are both connected to a bias voltage.

6. The charge-pump phase-locked loop of claim 1, wherein the fifth transistor and the sixth transistor remains in a saturation region, acting as high-load impedance.

7. The charge-pump phase-locked loop of claim 1, wherein the ninth transistor and the tenth transistor serve as voltage sources, The bias voltage is used to control the oscillation frequency of the differential delay unit.

8. The charge-pump phase-locked loop of claim 1, wherein the first coupling pair further comprises a first transistor pair, a second transistor pair, and a thirteenth transistor;

wherein the gate of the first transistor pair is connected to the signal $\overline{P_1}$, the source of the first transistor pair is connected to the drain of the first switching transistor, the drain of the first transistor pair is connected to a power supply, the gate and the drain of the second transistor pair are connected to the power supply, the source of the second transistor pair is connected to the drain of the second switching transistor, the thirteenth transistor serves as a current source, and the drain of the thirteenth transistor is separately connected to the source of the first switching transistor and the source of the second switching transistor;

wherein the second coupling pair further comprises a third transistor pair, a fourth transistor pair, and a fourteenth transistor; and wherein the gate and the drain of the third transistor pair are both connected to the power supply, the source of the third transistor pair is connected to the drain of the third switching transistor, the gate of the fourth transistor pair is connected to the drain of the first switching transistor, the drain of the fourth transistor pair is connected to the power supply, the source of the fourth transistor pair is connected to the drain of the fourth switching transistor, the fourteenth transistor serves as a current source, and the drain of the fourteenth transistor is separately connected to the source of the third switching transistor and the source of the fourth switching transistor.

9. A chip, comprising the charge-pump phase-locked loop of claim 1.

* * * * *